United States Patent [19]
Pesson et al.

[11] Patent Number: 5,444,910
[45] Date of Patent: Aug. 29, 1995

[54] PROCESS FOR ASSEMBLING A CONNECTOR INCORPORATING CURVED CONTACT ELEMENTS

[75] Inventors: Michel Pesson, Sille le Philippe; Michel Fonteneau, Le Mans, both of France

[73] Assignee: Framatome Connectors International, Paris la Defense, France

[21] Appl. No.: 288,737

[22] Filed: Aug. 16, 1994

Related U.S. Application Data

[63] Continuation of Ser. No. 42,629, Apr. 5, 1993, abandoned.

[30] Foreign Application Priority Data

Apr. 3, 1992 [FR] France ................................ 92 04066

[51] Int. Cl.⁶ ............................................ H01R 43/20
[52] U.S. Cl. .......................................... 29/878; 29/842; 29/883; 156/73.1
[58] Field of Search ................. 29/882, 883, 884, 842, 29/844; 156/73.1

[56] References Cited

U.S. PATENT DOCUMENTS 4,410,230 10/1983 San Miguel .
4,789,346 12/1988 Frantz .
4,860,445 8/1989 Jones .

FOREIGN PATENT DOCUMENTS 2160145 12/1985 United Kingdom .

*Primary Examiner*—Carl J. Arbes
*Attorney, Agent, or Firm*—Pollock, Vande Sande & Priddy

[57] ABSTRACT

Process for assembly of a connector incorporating an insulator (1) comprising a front part (2) in which working portions (30) of a plurality of contact elements (30, 33, 34) are inserted, these contact elements comprising bent rear portions (32), and distal ends (33) fitted into slots (21) in a rear wing (20) of the insulator (1). The process comprises immobilizing the distal ends (33) by thermoforming in their respective slots (21) without addition of material. The connector thus produced incorporates folds of material (40) solidly attached to the edges (23) of the corresponding slots (21), thereby allowing immobilization and precise position-retention of the contacts (30).

4 Claims, 3 Drawing Sheets

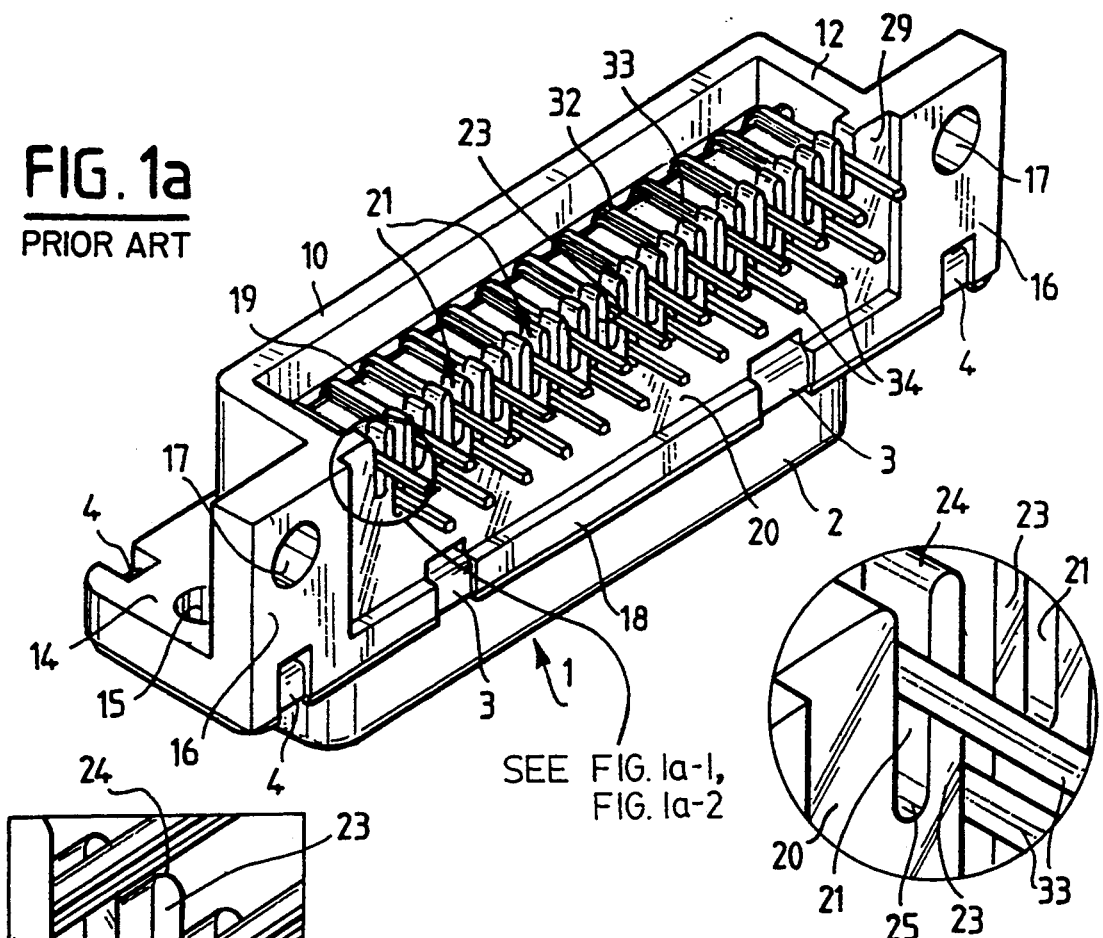
FIG. 1a PRIOR ART
FIG. 1a-1
FIG. 1a-2
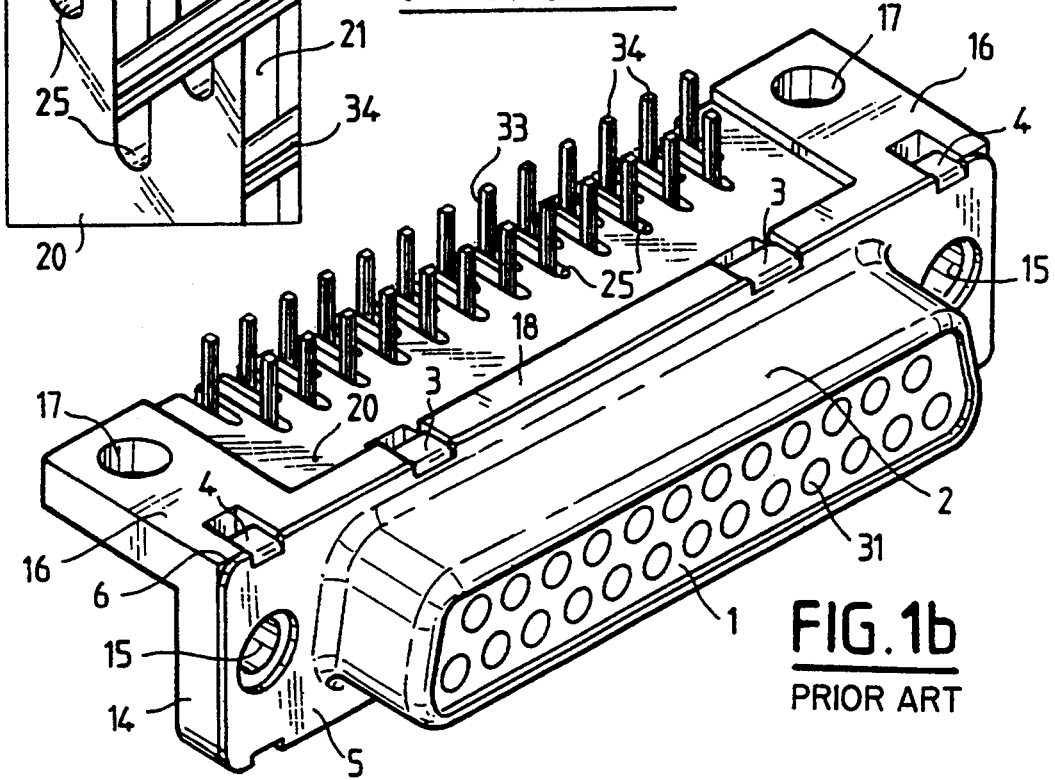
FIG. 1b PRIOR ART

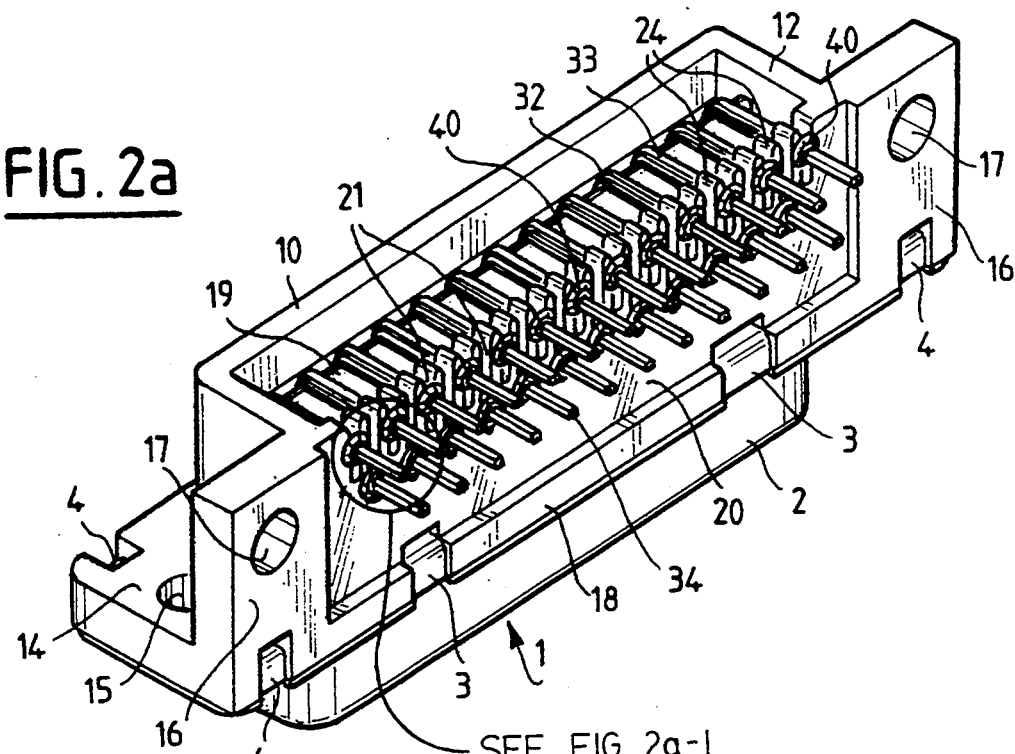
FIG. 2a
FIG. 2a-1
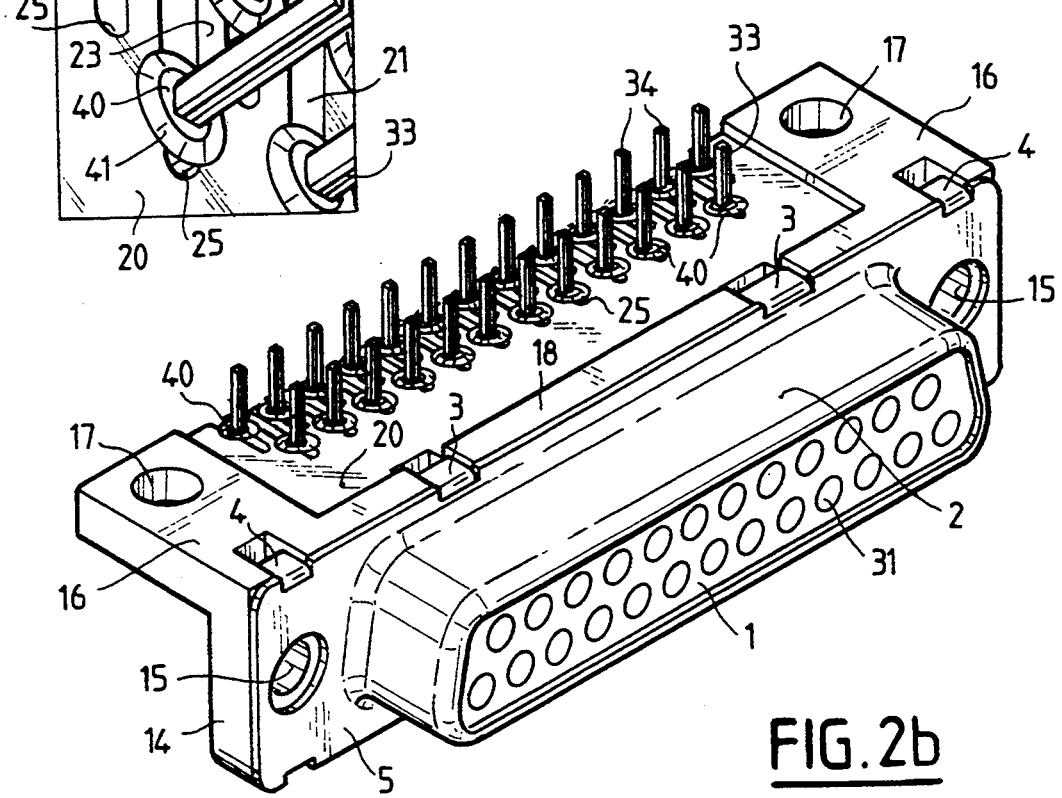
FIG. 2b

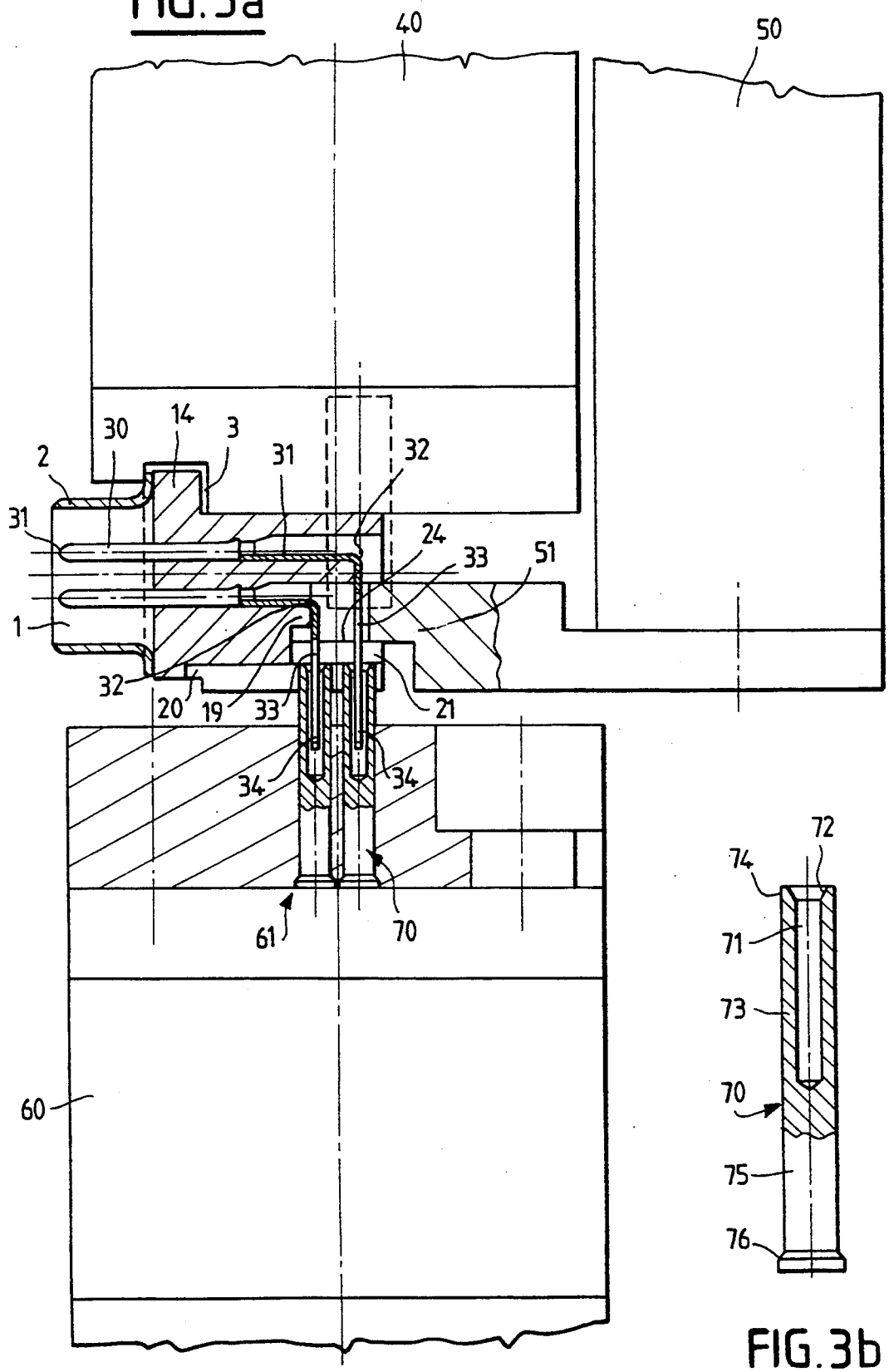

PROCESS FOR ASSEMBLING A CONNECTOR INCORPORATING CURVED CONTACT ELEMENTS

This application is a continuation of application Ser. No. 08/042,629 filed Apr. 5, 1993 now abandoned.

FIELD OF THE INVENTION

The invention relates to a process for assembling a connector incorporating bent contact elements in its rear part, thereby allowing them to be inserted in a printed circuit.

BACKGROUND OF THE INVENTION

PCT W0-88/7776 discloses the assembly of a connector of this kind, in which the distal ends of the rear parts of the bent elements are fitted into slots whose profiles make it possible to immobilize mechanically these distal ends in the respective slots.

The manufacture of this connector is made difficult because of the complicated hole shape required to achieve immobilization. Furthermore, insertion can only occur using contacts which have been preliminarily bent.

Conventional practice encompasses, moreover, a process for assembling a connector having bent contact elements, by mounting, in the insulator, a grid whose openings immobilize the distal ends of the contact elements in place. This procedure disadvantageously requires an additional part, which must latch in the insulator and which causes additional insertion play, thereby impairing the precision with which the contact elements are positioned.

SUMMARY OF THE INVENTION

The objects of the present invention is an assembly process which eliminates the aforementioned disadvantages.

The invention thus concerns a process for assembling a connector incorporating an insulator comprising a front part, in which working parts of a plurality of contact elements are inserted, these contact elements also incorporating bent rear parts having distal ends fitted into corresponding slots in a rear wing of the insulator. The process consists of immobilizing by thermoforming the distal ends of at least some of these contacts in their respective holes, without adding material.

It will be noted that the use of a comb-shaped rear wing and implementation of the thermoforming process makes it possible to immobilize several rows of contacts, regardless of their configuration, while preserving a simple geometry of slots in particular for three-row connectors, the distal arms being arranged in a line.

According to a preferred embodiment, the thermoforming operation is carried out using hollow pins which are heated to the thermoforming temperature of the material making up the insulator, and which are inserted through the distal ends of the contact elements, until a front end comes to rest on the edges of these slots. The hollow pins thus ensure relatively precise positioning of the distal ends of the contact elements during thermoforming. The front ends of the hollow pins may be substantially conical, thereby facilitating the insertion of the contacts and their repositioning.

The process may include the use of a position-maintenance part for holding the rear wing inplace during the thermoforming operation, thereby avoiding any shifting of the slots and allowing precise positioning during this operation.

This process is entirely compatible with the implementation of an in-place cambering step in order to bend the rear parts of the contact elements prior to the thermoforming step.

The invention also relates to a connector incorporating an insulator comprising a front part, in which functional parts of a plurality of contact elements are inserted, these elements also incorporating bent rear portions having distal ends fitted into corresponding slots in a rear wing of the insulator, the distal ends of at least certain contact elements being immobilized in the corresponding slots by means of folds of material solidly attached to the edges of these slots.

This structure proves particularly advantageous as it positions the distal ends the rear parts of the contact elements precisely, without requiring either added parts or complicated cut-out or molded shapes for the slots.

The folds of material advantageously enclose a major portion of these distal ends, and are preferably constituted by a thermoforming impression.

BRIEF DESCRIPTION OF THE DRAWINGS

Other features and advantages of the invention will emerge from the following description provided by way of example and with reference to the drawings, in which:

FIGS. 1a and 1b are perspective views of a prior art connector incorporating bent rear leads, FIG. 1a further being supplemented by detail FIGS. 1a-1 and 1a-2;

FIGS. 2a and 2b are perspective views of a connector according to a preferred embodiment of the invention, FIG. 2a comprising a detail view in the inset illustrating the thermoforming impression and;

FIGS. 3a and 3b show, respectively, in transverse cross-section, a connector according to the invention during a thermoforming step; and a partial longitudinal cross-section of a pin according to the invention.

DESCRIPTION OF THE PREFERRED EMBODIMENT

In accordance with FIGS. 1a and 1b, a prior art connector as manufactured by applicant comprises an insulator having a front part 1 raised in relation to a flat front face 6 of a rectangular support plate 14. A wing comprising a central portions 20 and two lateral portions 16 extends perpendicularly to the support plate 14. In front, the central area 20 is slightly recessed thus forming a parallelepiped-shaped passage 29. Smooth mounting holes 15 and 17 are provided, respectively, in the rectangular plate 14 and in the wings 16 at the longitudinal ends of the connectors. A shielding conducting box comprising a portion 2 adapted to the raised front part 1 and a flat area 5 abutting the front face 6 is held in place by means of attachment lugs 3 and 4, which are folded, respectively, over an edge 18 abutting the passage 29 and in the wings 16. Contact elements (see FIG. 3a) having active front portions 30 of the "male" type which are set back from the corresponding opening 31 in the front insulator 1, are extended toward the rear of the connector by a rear portion having a first straight-line section 31 in the extension of the active front part 30, a bend 32, and a distal portion 33 terminating in an end 34 which can be inserted into the holes of a printed circuit, for example.

Two rows of contact elements arranged in a staggered configuration are illustrated, each contact element being fitted into a slot 21, the slots being separated by edges 23 terminating in rounded distal portions 24. The bends 32 of the contact elements are folded around edges 19 which form an integral part of the insulator and are molded with the latter. Finally, the insulator incorporates a U-shaped box portion which encloses the contact element and comprises a longitudinal, rectangular portion 10 and two lateral faces 12, which rest on the front plate 14, connect with the wings 16 of the insulator and form a trihedron with the ends of the support plates 14 and the wings 16.

As shown in FIGS. 2a and 2b, the contact elements immobilized in the slots 21 by means of impressions which surround distal parts 33, preferably over their entire circumference, these distal parts being solidly attached to the edges of the slots 21, a portion of whose circumference they interrupt.

As shown in FIGS. 3a and 3b, these impressions are made using hollow pins 70 having a central cylindrical body 75 extended rearward by a flange 76 which holds the pin in place in a part 60, a blind hole 71 opening onto the front part of the pin 70 so as to delimit a front part 74 having an internal portion 72 which is conically flared toward the outside. This pin shape delineates the shape of the impressions as illustrated in the inset in FIG. 2a.

To carry out the thermoforming operation, a number of pins 70 corresponding to the number of contact elements 30 to be held in position is inserted in openings debouching in the front part 61 of a thermoformed mounting piece 60. The distal ends 34 of the end portions 33 of the rear parts of the contact elements 30 are inserted into the blind holes 71 in the hollow pins 70, and part 60 is shifted until it comes into abutment against the edges 23 which separate the slots 21 and are forcefully pressed into these slots so as to produce the thermoformed impressions 40 by melting the material, the pins 70 having been pre-heated to a thermoforming temperature of the material making up the connector insulator. The conically flared portion 72 acts as a chamfer for insertion of the distal ends 33, 34, which are held in position with the desired precision in the blind holes 71.

To carry out the operation, the upper edge of front plate 14 is immobilized in place by means of a piece 40 cooperating with a part 50 having a front end 51 which forms a front stop on the extremities 24 of the edges 23, and holds the rear portion of the insulator in place. The process is preferably automated by a feed system supplying a succession of connectors on an assembly line, where the thermoforming operation is, accordingly, entirely automatic.

We claim:

1. Process for assembly of a connector incorporating an insulator comprising a front portion in which working parts of a plurality of contact elements are inserted, said contact elements comprising bent rear portions incorporating a distal end fitted into a corresponding slot in a rear wing of said insulator, said process comprising the steps of
    (a) heating hollow pins (70) to a thermoforming temperature of material making up said insulator (1,20);
    (b) inserting said distal ends (33) of said contact elements into blind holes (71) in said hollow pins until front ends (74) of said hollow pins abut against edges (23) of said slots (21) of said rear wing;
    (c) forcefully pressing said front ends of said hollow pins into said slots to produce, by melting said material of said insulator, thermoformed impressions (4) in which said distal ends are immobilized.

2. Process according to claim 1, including providing said front ends (74) of said hollow pins (70) with a substantially conical shape.

3. Process according to claim 1, comprising a position-retention piece (61) holding the rear wing (20) in place during the thermoforming operation.

4. Process according to claim 1, comprising an in situ bending operation in order to bend the rear parts (33) of the contact elements (30, 34) prior to said thermoforming step.

* * * * *